(12) United States Patent
Machida

(10) Patent No.: US 9,293,433 B2
(45) Date of Patent: Mar. 22, 2016

(54) INTERMETALLIC COMPOUND LAYER ON A PILLAR BETWEEN A CHIP AND SUBSTRATE

(71) Applicant: SHINKO ELECTRIC INDUSTRIES CO., LTD., Nagano (JP)

(72) Inventor: Yoshihiro Machida, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 14/535,535

(22) Filed: Nov. 7, 2014

(65) Prior Publication Data

US 2015/0162292 A1 Jun. 11, 2015

(30) Foreign Application Priority Data

Dec. 10, 2013 (JP) ................. 2013-255414

(51) Int. Cl.
*H01L 23/48* (2006.01)
*H01L 21/44* (2006.01)
(Continued)

(52) U.S. Cl.
CPC ............ *H01L 24/16* (2013.01); *H01L 23/4822* (2013.01); *H01L 24/11* (2013.01); *H01L 24/13* (2013.01); *H01L 24/33* (2013.01); *H01L 24/81* (2013.01); *H01L 23/49816* (2013.01); *H01L 23/564* (2013.01); *H01L 24/05* (2013.01); *H01L 2224/0401* (2013.01); *H01L 2224/05124* (2013.01); *H01L 2224/05666* (2013.01); *H01L 2224/119* (2013.01); *H01L 2224/1182* (2013.01); *H01L 2224/1184* (2013.01); *H01L 2224/11822* (2013.01); *H01L 2224/13014* (2013.01); *H01L 2224/13016* (2013.01); *H01L 2224/13017* (2013.01); *H01L 2224/13019* (2013.01); *H01L 2224/13021* (2013.01); *H01L 2224/13023* (2013.01); *H01L 2224/13082* (2013.01); *H01L 2224/13083* (2013.01); *H01L 2224/13111* (2013.01); *H01L 2224/13147* (2013.01); *H01L 2224/13155* (2013.01); *H01L 2224/13564* (2013.01); *H01L 2224/13565* (2013.01); *H01L 2224/13687* (2013.01);
(Continued)

(58) Field of Classification Search
CPC ......... H01L 24/81; H01L 24/16; H01L 24/11; H01L 24/13; H01L 24/33; H01L 23/4822; H01L 23/49816; H01R 43/0235
See application file for complete search history.

(56) References Cited

U.S. PATENT DOCUMENTS 7,554,201 B2 * 6/2009 Kang et al. ............... 257/772
8,664,760 B2 * 3/2014 Yu et al. ................... 257/737
(Continued)

FOREIGN PATENT DOCUMENTS

JP 2004-048012 2/2004

*Primary Examiner* — Alonzo Chambliss
(74) *Attorney, Agent, or Firm* — IPUSA, PLLC

(57) ABSTRACT

A semiconductor package includes a wiring substrate that includes a first conductive member; a semiconductor chip that is mounted on the wiring substrate and includes a second conductive member, the first conductive member and the second conductive member being positioned to face each other; and a bonding member that bonds and electrically connects the first conductive member and the second conductive member, at least one of the first conductive member and the second conductive member being a pillar-shaped terminal, the bonding member being bonded to an end surface of the pillar-shaped terminal and a portion of a side surface of the pillar-shaped terminal, an intermetallic compound layer being formed at an interface of the bonding member and the pillar-shaped terminal.

9 Claims, 10 Drawing Sheets

(51) Int. Cl.
*H01L 23/00* (2006.01)
*H01L 23/482* (2006.01)
*H01L 23/498* (2006.01)
*H01R 43/02* (2006.01)

(52) U.S. Cl.
CPC ............ *H01L 2224/13694* (2013.01); *H01L 2224/1601* (2013.01); *H01L 2224/16058* (2013.01); *H01L 2224/16059* (2013.01); *H01L 2224/16237* (2013.01); *H01L 2224/16238* (2013.01); *H01L 2224/16503* (2013.01); *H01L 2224/73204* (2013.01); *H01L 2224/81011* (2013.01); *H01L 2224/81022* (2013.01); *H01L 2224/81024* (2013.01); *H01L 2224/81047* (2013.01); *H01L 2224/8181* (2013.01); *H01L 2224/81193* (2013.01); *H01L 2224/81201* (2013.01); *H01L 2224/81447* (2013.01); *H01L 2224/81815* (2013.01); *H01L 2224/81986* (2013.01); *H01L 2924/15313* (2013.01); *H01L 2924/35121* (2013.01); *H01L 2924/381* (2013.01); *H01L 2924/3841* (2013.01); *H01R 43/0235* (2013.01)

(56) References Cited

U.S. PATENT DOCUMENTS

| | | | |
|---|---|---|---|
| 2004/0007779 A1* | 1/2004 | Arbuthnot et al. | 257/780 |
| 2006/0065978 A1* | 3/2006 | Nishiyama et al. | 257/737 |
| 2011/0001250 A1* | 1/2011 | Lin et al. | 257/778 |
| 2012/0007228 A1* | 1/2012 | Lu et al. | 257/692 |
| 2012/0007231 A1* | 1/2012 | Chang | 257/737 |
| 2012/0091577 A1* | 4/2012 | Hwang et al. | 257/737 |
| 2013/0015576 A1* | 1/2013 | Lin | 257/737 |
| 2013/0134581 A1* | 5/2013 | Lin et al. | 257/737 |
| 2013/0221520 A1* | 8/2013 | Uno et al. | 257/737 |
| 2014/0061897 A1* | 3/2014 | Lin et al. | 257/737 |
| 2014/0124924 A1* | 5/2014 | Chang | 257/737 |
| 2014/0167254 A1* | 6/2014 | Yu et al. | 257/737 |
| 2014/0191396 A1* | 7/2014 | Lin et al. | 257/737 |

* cited by examiner

INTERMETALLIC COMPOUND LAYER ON A PILLAR BETWEEN A CHIP AND SUBSTRATE

CROSS-REFERENCE TO RELATED APPLICATION

The present application is based on and claims the benefit of priority of Japanese Priority Application No. 2013-255414 filed on Dec. 10, 2013, the entire contents of which are hereby incorporated by reference.

BACKGROUND OF THE INVENTION

1. Field of the Invention

The present invention relates to a semiconductor package and a method of manufacturing a semiconductor package.

2. Description of the Related Art

Conventionally, a semiconductor package is known in which a semiconductor chip including pillar-shaped terminals (electrode terminals each having a cylindrical shape) is flip-chip mounted on a wiring substrate. Such a semiconductor package is manufactured by providing solder between a front end portion of each pillar-shaped terminal of a semiconductor chip and each pad of a wiring substrate, heating the solder and solidifying the solder, for example.

However, when bonding the semiconductor chip and the wiring substrate through the solder that exists at the front end portion of each of the pillar-shaped terminals, the solder easily spreads in a lateral direction and easily contacts the adjacent pillar-shaped terminal or the like. Thus, it is difficult to form the pillar-shaped terminals with a narrow pitch.

By making the diameter of each of the pillar-shaped terminals small, the pillar-shaped terminals may be formed with a small pitch. However, in such a case, as a surface area of a bonding of the pillar-shaped terminal and the solder becomes small, there is another problem that the connection reliability becomes lower.

PATENT DOCUMENT

[Patent Document 1] Japanese Laid-open Patent Publication No. 2004-48012

SUMMARY OF THE INVENTION

The present invention is made in light of the above problems, and provides a semiconductor package or the like capable of forming pillar-shaped terminals with a narrow pitch while maintaining connection reliability.

According to an embodiment, there is provided semiconductor package including a wiring substrate that includes a first conductive member; a semiconductor chip that is mounted on the wiring substrate and includes a second conductive member, the first conductive member and the second conductive member being positioned to face each other; and a bonding member that bonds and electrically connects the first conductive member and the second conductive member, at least one of the first conductive member and the second conductive member being a pillar-shaped terminal, the bonding member being bonded to an end surface of the pillar-shaped terminal and a portion of a side surface of the pillar-shaped terminal, an intermetallic compound layer being formed at an interface of the bonding member and the pillar-shaped terminal.

According to another embodiment, there is provided a method of manufacturing a semiconductor package, including preparing a wiring substrate that includes a pad and a semiconductor chip that includes a pillar-shaped terminal; adhering an active component capable of removing an oxide film, to a portion of a side surface of the pillar-shaped terminal of the semiconductor chip; and forming a bonding member that bonds and electrically connects the pad and the pillar-shaped terminal, wherein in the forming the bonding member, the bonding member bonds an end surface of the pillar-shaped terminal at a pad side, a portion of a side surface of the pillar-shaped terminal, and an end surface of the pad at a pillar-shaped terminal side, and an intermetallic compound layer is formed at an interface of the bonding member and the pillar-shaped terminal.

Note that also arbitrary combinations of the above-described elements, and any changes of expressions in the present invention, made among methods, devices, systems and so forth, are valid as embodiments of the present invention.

BRIEF DESCRIPTION OF THE DRAWINGS

Other objects, features and advantages of the present invention will become more apparent from the following detailed description when read in conjunction with the accompanying drawings.

DETAILED DESCRIPTION OF THE PREFERRED EMBODIMENTS

Figure 1A:
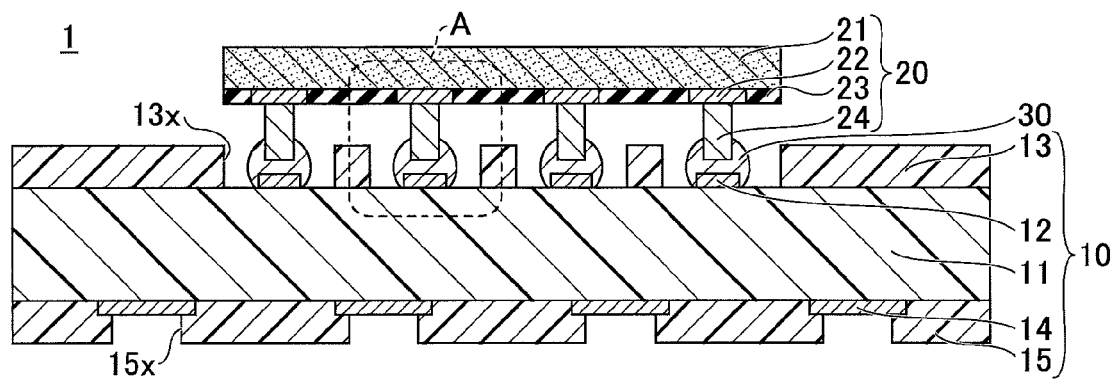
FIG. 1A and FIG. 1B are cross-sectional views illustrating an example of a semiconductor package of a first embodiment.

The invention will be described herein with reference to illustrative embodiments. Those skilled in the art will recognize that many alternative embodiments can be accomplished using the teachings of the present invention and that the invention is not limited to the embodiments illustrated for explanatory purposes.

It is to be noted that, in the explanation of the drawings, the same components are given the same reference numerals, and explanations are not repeated.

First Embodiment

Structure of Semiconductor Package of First Embodiment

Figure 1B:
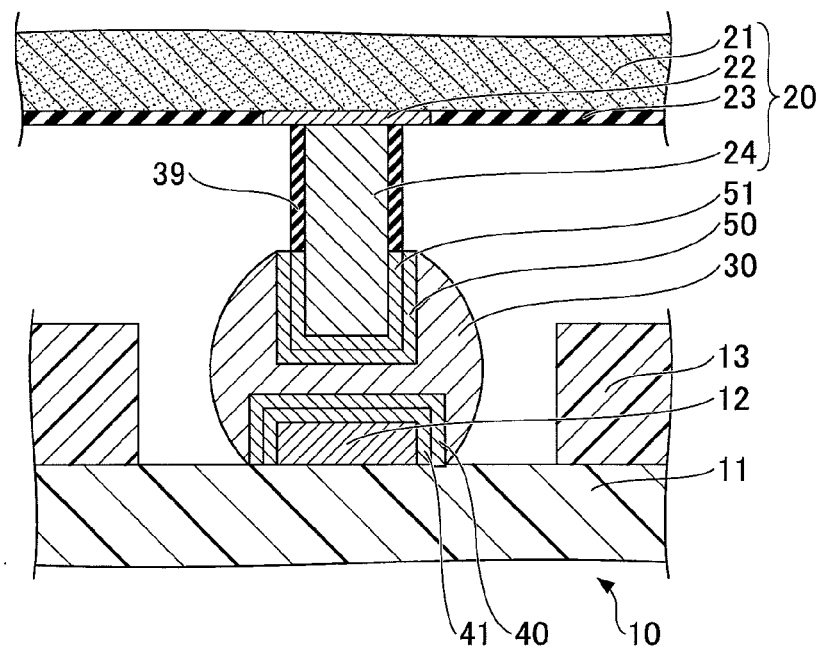

First, a structure of a semiconductor package of a first embodiment is explained. FIG. 1A and FIG. 1B are cross-sectional views illustrating a semiconductor package 1 of the first embodiment. FIG. 1B is an enlarged cross-sectional view of a portion A in FIG. 1A. With reference to FIG. 1A and FIG. 1B, the semiconductor package 1 of the first embodiment includes a wiring substrate 10, a semiconductor chip 20 and bonding members 30.

In this embodiment, a semiconductor substrate 21 side, which will be explained later, is referred to as an upper side or one side, and a solder resist layer 15 side, which will also be explained later, is referred to as a lower side or the other side. Further, a surface of each components at the semiconductor substrate 21 side is referred to as an upper surface or one surface, and a surface at the solder resist layer 15 side is referred to as a lower surface or the other surface. However, the semiconductor package 1 may be used in an opposite direction or may be used at an arbitrarily angle. Further, in this embodiment, "in a plan view" means that an object is seen in a direction that is normal to one surface of the wiring substrate 10, and a "plan shape" means a shape of an object seen in the direction that is normal to the one surface of the wiring substrate 10.

The wiring substrate 10 includes an insulating layer 11, pads 12, a solder resist layer 13, pads 14 and a solder resist layer 15. The insulating layer 11 may include insulating resin such as thermosetting epoxy-based resin or the like as a main constituent, for example. The insulating layer 11 may be obtained by impregnating insulating resin such as thermosetting epoxy-based resin or the like in a glass cloth (woven fabric), a glass nonwoven fabric, an aramid-fiber or the like. Alternatively, instead of using the insulating layer 11, a build-up layer may be used in which a plurality of insulating layers and a plurality of wiring layers are alternately stacked with each other and different wiring layers are connected through vias. Alternatively, ceramics, silicon whose surface is covered by an insulating film, or the like may be used as the insulating layer 11.

The pads 12 are electrically connected to the semiconductor chip 20 and are formed at one surface of the insulating layer 11. The pads 12 are a part of a wiring layer (not illustrated in the drawings) formed at the one surface of the insulating layer 11. The wiring layer includes a wiring pattern or the like in addition to the pads 12. The plan shape of each of the pads 12 may be a circular shape with a diameter of about 10 to 50 μm, for example. The pitch of the pads 12 may be about 30 to 40 μm, for example. For the material of the pads 12, copper (Cu) or the like may be used, for example.

The solder resist layer 13 is formed at the one surface of the insulating layer 11 such as to cover the wiring layer (not illustrated in the drawings). The solder resist layer 13 may be made of photosensitive resin of epoxy-based resin or acrylic-based resin, or the like, for example. The thickness of the solder resist layer 13 may be about 15 to 35 μm, for example. The solder resist layer 13 is provided with open portions 13x and the pads 12 are exposed in the open portions 13x, respectively. The plan shape of each of the open portions 13x may be a circular shape, for example. The diameter of the open portion 13x may be arbitrarily designed based on the diameter of each of the pads 12.

In this embodiment, the solder resist layer 13 is provided such that a space is formed between a side surface of the open portion 13x and a side surface of the respective pad 12. However, the solder resist layer 13 may be provided such that the side surface of the open portion 13x and the side surface of the respective pad 12 contact, or the solder resist layer 13 may be provided to cover an outer edge portion of the respective pad 12. However, as it is difficult to accurately form the small open portion 13x, if the diameter of the pad 12 is small and the pads 12 are provided with a narrow pitch, it is easy to form the solder resist layer 13 with the open portions 13x each having a larger diameter such that a space is formed between a side surface of the open portion 13x and a side surface of the respective pad 12.

The pads 14 are electrically connected to a mount board such as a motherboard or the like (not illustrated in the drawings) and are formed at the other surface of the insulating layer 11. The pads 14 are a part of a wiring layer (not illustrated in the drawings) formed at the other surface of the insulating layer 11. The wiring layer includes a wiring pattern or the like in addition to the pads 14. The plan shape of each of the pads 14 may be a circular shape with a diameter of about 100 to 300 μm, for example. The pitch of the pads 14 may be about 400 to 500 μm, for example. For the material of the pads 14, copper (Cu) or the like may be used, for example. The pads 14 may be electrically connected to the pads 12 through wirings or vias provided in the insulating layer 11, respectively.

The solder resist layer 15 is formed at the other surface of the insulating layer 11 such as to cover the wiring layer (not illustrated in the drawings). The solder resist layer 15 may be made of photosensitive resin of epoxy-based resin or acrylic-based resin, or the like, for example. The thickness of the solder resist layer 15 may be about 15 to 35 μm, for example. The solder resist layer 15 is provided with open portions 15x and a portion of the pads 14 is exposed in each of the open portions 15x. The plan shape of each of the open portions 15x may be a circular shape, for example. The diameter of the open portion 15x may be arbitrarily designed based on the diameter of the diameter of each of the pads 14.

The solder resist layer 15 may be provided such that the entirety of the each of the pads 14 is exposed in the respective open portion 15x. In such a case, the solder resist layer 15 may be provided such that a side surface of the open portion 15x and a side surface of the respective pad 14 contact with each other, or may be provided such that a space is provided between the side surface of the open portion 15x and the side surface of the respective pad 14.

The semiconductor chip 20 includes a semiconductor substrate 21, pads 22, a protection film 23 and pillar-shaped terminals 24. The semiconductor substrate 21 is made of silicon or the like and includes a semiconductor integrated circuit formed at a circuit forming surface (a surface facing the wiring substrate 10 in FIG. 1A and FIG. 1B). The pads 22 are provided at the circuit forming surface of the semiconductor substrate 21 and are electrically connected with the semiconductor integrated circuit. Each of the pads 22 may have a structure in which a barrier metal such as titan (Ti) or the like is formed on aluminium (Al), for example. The protection film 23 is provided to protect the semiconductor integrated circuit and provided at a circuit forming surface side of the semiconductor substrate 21 such as to expose the pads 22. For the protection film 23, a SiN film, a PSG film or the like may be used, for example.

The pillar-shaped terminal 24 is an electrode terminal that is provided on each of the pads 22. Each of the pillar-shaped terminals 24 may have a cylindrical shape where the diameter of an end surface is about 20 to 30 μm, for example. The height (thickness) of the pillar-shaped terminal 24 may be about 5 to 50 μm, for example. Further, it is preferable that the height (thickness) of the pillar-shaped terminal 24 is about 20 to 30 μm (the ratio of the diameter and the height of the pillar-shaped terminal 24 are nearly 1:1), because it is easy to manufacture. The pitch of the pillar-shaped terminals 24 may be about 30 to 40 μm, for example. For the material of the pillar-shaped terminals 24, copper (Cu) or the like may be used. Each of the pillar-shaped terminals 24 may have an elliptic cylindrical shape, a prism shape or the like, or each of the pillar-shaped terminals 24 may be formed such that a front end portion of a cylindrical shape is tapered or the like. Further, in this embodiment, an electrode terminal provided on a pad is referred to as a pillar-shaped terminal regardless of its height (thickness).

The bonding members 30 bond and electrically connect the pads 12 of the wiring substrate 10 and the pillar-shaped terminals 24 of the semiconductor chip 20, respectively. Each of the bonding members 30 is formed at an upper surface and a side surface of the respective pad 12 and a lower surface (a surface facing the respective pad 12) and a lower end side (pad 12 side) of a side surface of the respective pillar-shaped terminal 24. For the bonding members 30, solder such as alloy of Sn and Cu, alloy of Sn and Sb, alloy of Sn and Ag, alloy of Sn, Ag and Cu, or the like may be used. Underfill resin (not illustrated in the drawings) that covers the bonding members 30 may be provided between the wiring substrate 10 and the semiconductor chip 20.

As illustrated in FIG. 1B, a first intermetallic compound layer 40 and a second intermetallic compound layer 41 are generated at an interface of the bonding member 30 and the pad 12. When the bonding member 30 is made of a material including tin (Sn) and the pad 12 is made of copper (Cu), an intermetallic compound whose composition is $Cu_6Sn_5$ is generated at a bonding member 30 side, as the first intermetallic compound layer 40. Further, an intermetallic compound whose composition is $Cu_3Sn$ is generated at a pad 12 side, as the second intermetallic compound layer 41.

Similarly, a third intermetallic compound layer 50 and a fourth intermetallic compound layer 51 are generated at an interface of the bonding member 30 and the pillar-shaped terminal 24. When the bonding member 30 is made of a material including tin (Sn) and the pillar-shaped terminal 24 is made of copper (Cu), an intermetallic compound whose composition is $Cu_6Sn_5$ is generated at a bonding member 30 side, as the third intermetallic compound layer 50. Further, an intermetallic compound whose composition is $Cu_3Sn$ is generated at a pillar-shaped terminal 24 side, as the fourth intermetallic compound layer 51.

Although the first intermetallic compound layer 40 and the third intermetallic compound layer 50 are illustrated to have substantially the same thickness in FIG. 1B, actually, the first intermetallic compound layer 40 and the third intermetallic compound layer 50 are formed to have different thicknesses (the same for FIG. 2, which will be explained later).

As such, in this embodiment, different metal elements are diffused with each other such that a composition at their interface continues to form new intermetallic compounds (alloys) in which the metal element are mixed are formed at the interface of the bonding member 30 and the pad 12, and the interface of the bonding member 30 and the pillar-shaped terminal 24, respectively. In particular, the third intermetallic compound layer 50 and the fourth intermetallic compound layer 51, which are intermetallic compounds, are formed at the interface of the bonding member 30 and the lower end side of the side surface (pad 12 side) of the pillar-shaped terminal 24, in addition to the interface of the bonding member 30 and the lower surface (the surface facing the pad 12) of the pillar-shaped terminal 24. As a result, the bonding member 30 and the pillar-shaped terminal 24 are strongly bonded. As an oxide film 39 such as copper oxide or the like is formed at an upper end side (semiconductor chip 20 side) of the side surface of the pillar-shaped terminal 24, the bonding member 30 is not formed at the upper end side of the side surface of the pillar-shaped terminal 24 because the solder that constitutes the bonding member 30 does not wet on and spread on the upper end side of the side surface of the pillar-shaped terminal 24. As such, the oxide film 39 is formed at an area of the side surface of the pillar-shaped terminal 24 where the bonding member 30 is not bonded.

Figure 2:
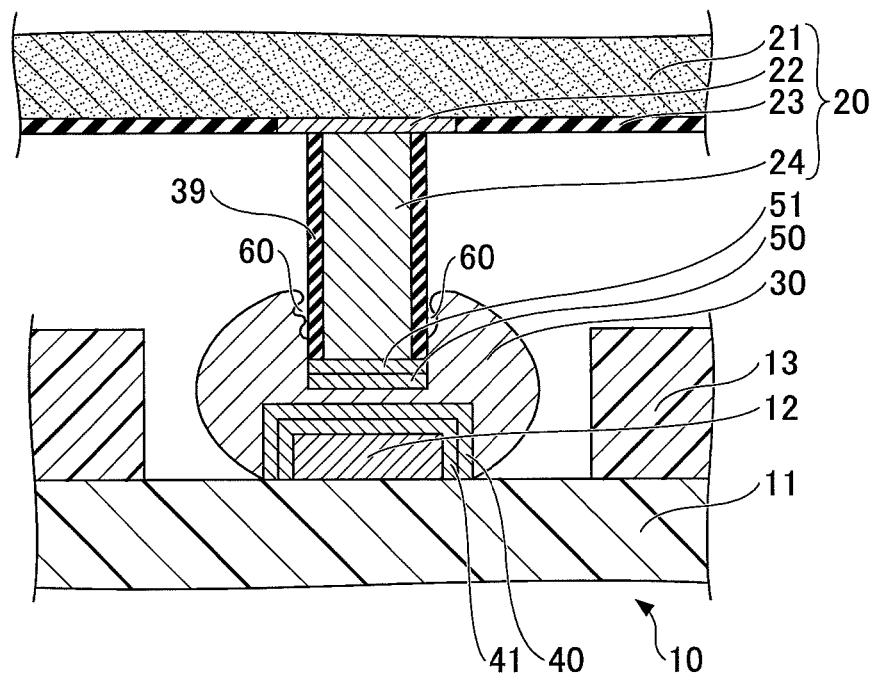
FIG. 2 is a partial cross-sectional view illustrating a relative example.

FIG. 2 is a partial cross-sectional view illustrating a relative example, and is a cross-section corresponding to FIG. 1B. With reference to FIG. 2, in the relative example, the third intermetallic compound layer 50 and the fourth intermetallic compound layer 51 are formed at the interface of the bonding member 30 and the lower surface of the pillar-shaped terminal 24. However, the third intermetallic compound layer 50 and the fourth intermetallic compound layer 51 are not formed at the interface of the bonding member 30 and the lower end side of the side surface of the pillar-shaped terminal 24. This means that the bonding member 30 and the lower surface of the pillar-shaped terminal 24 are bonded, however, the bonding member 30 and the lower end side of the side surface of the pillar-shaped terminal 24 only contact with each other and are not bonded with each other. Further, a void 60 is formed between the bonding member 30 and the lower end side of the side surface of the pillar-shaped terminal 24.

As the oxide film 39 is formed at the entirety of the side surface of the pillar-shaped terminal 24 in the relative example, the solder of the bonding member 30 does not wet on the side surface of the pillar-shaped terminal 24 at all. Thus, the bonding member 30 and the lower end side of the side surface of the pillar-shaped terminal 24 are not bonded with each other. In such a state, the solder of the bonding member 30 easily spreads in a lateral direction and easily contacts the adjacent bonding member 30. Thus, it is difficult to form the pillar-shaped terminals 24 with a narrow pitch.

Further, as a surface area of the bonding member 30 and the pillar-shaped terminal 24 is small (only the area of the lower surface of the pillar-shaped terminal 24), the bonding between the bonding member 30 and the pillar-shaped terminal 24 becomes unstable. In particular, when the diameter of the pillar-shaped terminal 24 is small, this becomes a significant problem.

Further, as the void 60 formed between the bonding member 30 and the lower end side of the side surface of the pillar-shaped terminal 24 is a small space, it is difficult to fill the void 60 by underfill resin when providing the underfill resin that covers the bonding member 30. Thus, peeling may occur in the vicinity of the void 60 that is caused by moisture absorption when the semiconductor package is used in a condition such as at high temperature and high humidity or the like.

On the other hand, according to the embodiment, as described above, as the intermetallic compounds are formed at the interface of the bonding member 30 and the lower surface of the pillar-shaped terminal 24, and the interface of the bonding member 30 and the lower end side of the side surface of the pillar-shaped terminal 24, the bonding member 30 and the lower surface and the lower end side of the side surface of the pillar-shaped terminal 24 are strongly bonded. As a result, the above problem generated in the relative example can be avoided.

(Method of Manufacturing Semiconductor Package of First Embodiment)

Next, a method of manufacturing the semiconductor package 1 of the first embodiment is explained. In particular, steps of bonding the wiring substrate 10 and the semiconductor chip 20 through the bonding members 30 are mainly explained. FIG. 3A to FIG. 5B are views illustrating the method of manufacturing the semiconductor package 1 of the first embodiment and are cross-sections corresponding to FIG. 1B.

Figure 3A:
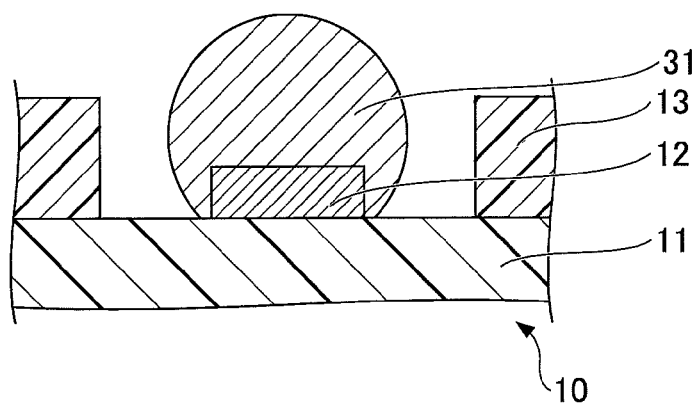
FIG. 3A to FIG. 3C are views illustrating an example of a method of manufacturing the semiconductor package, of the first embodiment.

First, in a step illustrated in FIG. 3A, the wiring substrate 10 manufactured by a known method is prepared. Then, an electrical conductive paste material 31 is formed on the pad 12 of the wiring substrate 10. The electrical conductive material 31 finally becomes a portion of the bonding member 30. For the electrical conductive material 31, solder such as alloy of Sn and Cu, alloy of Sn and Sb, alloy of Sn and Ag, alloy of Sn, Ag and Cu, or the like may be used, for example.

Figure 3B:
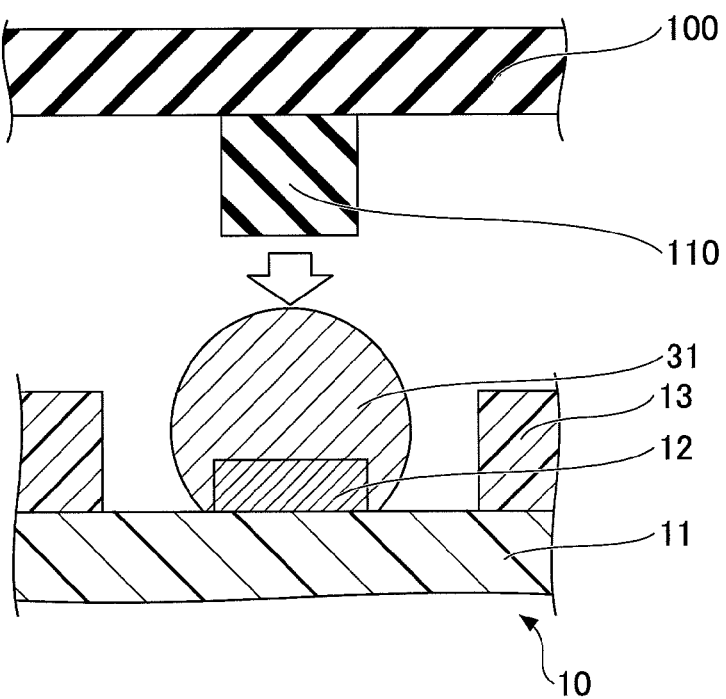
Figure 3C:
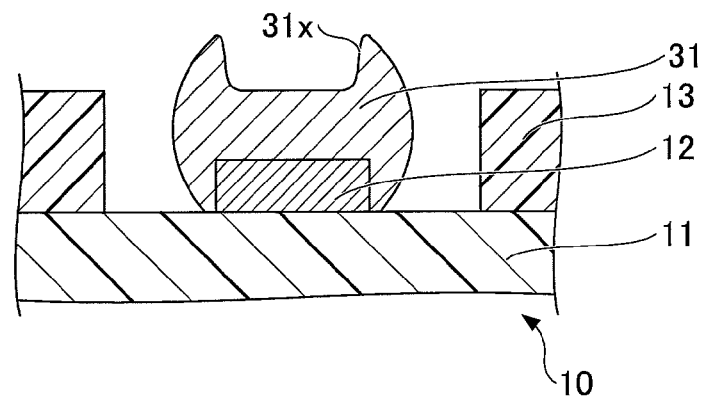

Next, in steps illustrated in FIG. 3B and FIG. 3C, a jig 100 provided with a protruding portion 110 having a cylindrical shape, for example, is prepared. Then, by contacting the protruding portion 110 at an upper portion of the electrical conductive material 31 and pushing the electrical conductive material 31 toward the wiring substrate 10 side, a concave portion 31x is formed as illustrated in FIG. 3C. The depth and the size in a plan view of the concave portion 31x can be appropriately determined based on the amount of an active component 220, which will be explained later, to be adhered to the side surface of the pillar-shaped terminal 24. In other words, the depth and the size in a plan view of the concave portion 31x can be appropriately determined based on how high the active component 220 is to be formed at the side surface.

Figure 4A:
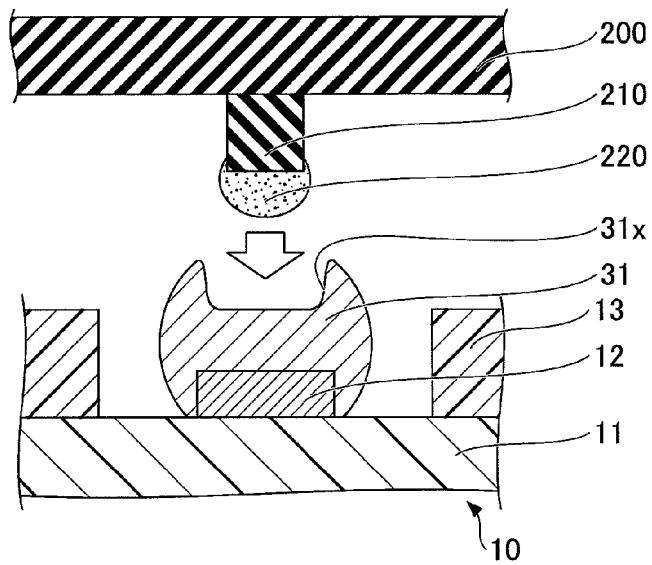
FIG. 4A to FIG. 4C are views illustrating an example of the method of manufacturing the semiconductor package of the first embodiment.
Figure 4B:
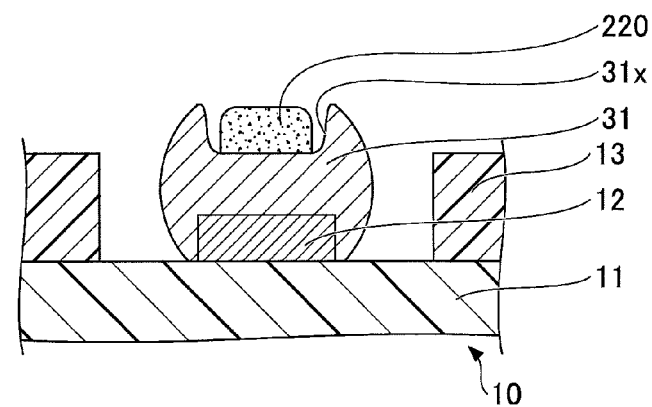

Next, in steps illustrated in FIG. 4A and FIG. 4B, a jig 200 provided with a transferring pin 210 having a cylindrical shape, for example, is prepared. Then the active component 220 is adhered at a front end portion of the transferring pin 210. Thereafter, as illustrated in FIG. 4B, the active component 220 is transferred in the concave portion 31x of the electrical conductive material 31. The active component 220 is a liquid or paste material that has a function to remove an oxide film formed at a surface of copper (Cu) or the like. For the active component 220, carboxylic acid or the like that includes carboxyl group may be used, for example.

Figure 4C:
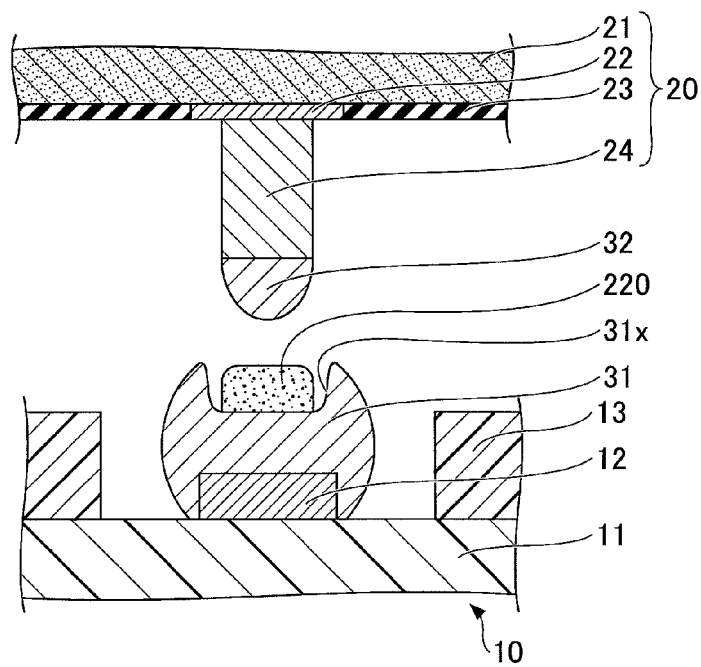

Next, in a step illustrated in FIG. 4C, a semiconductor chip 20 manufactured by a known method is prepared. Then, an electrical conductive paste material 32 is formed at the lower end side of the pillar-shaped terminal 24 of the semiconductor chip 20. Then, the semiconductor chip 20 is positioned on the wiring substrate 10 such that the pillar-shaped terminal 24 faces the pad 12. The electrical conductive material 32 finally becomes a portion of the bonding member 30. For the electrical conductive material 32, solder same as the electrical conductive material 31 may be used, for example. Here, at this time, the oxide film (not illustrated in the drawings) is formed at the entirety of the side surface of the pillar-shaped terminal 24.

Figure 5A:
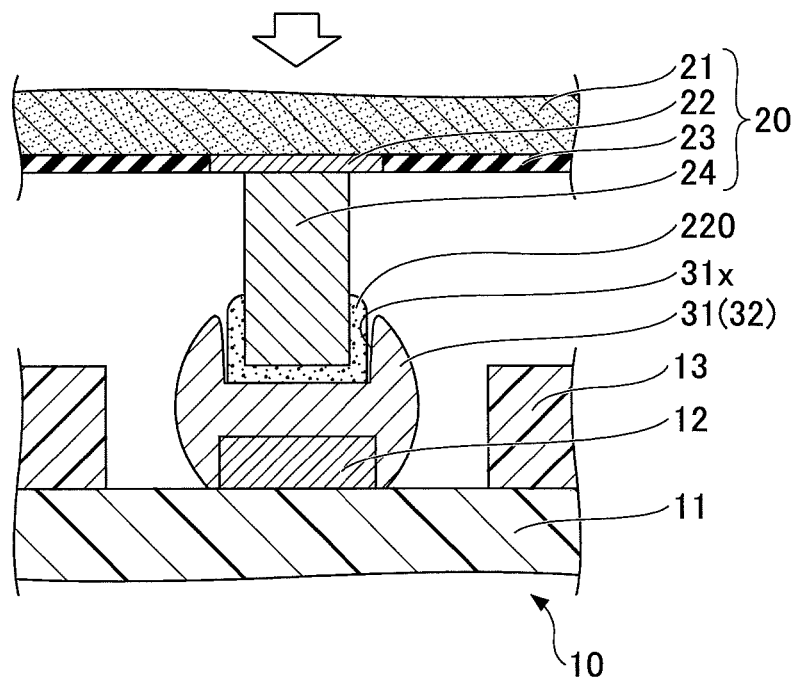
FIG. 5A and FIG. 5B are views illustrating an example of the method of manufacturing the semiconductor package of the first embodiment.

Next, in a step illustrated in FIG. 5A, the semiconductor chip 20 is pushed toward the wiring substrate 10 side and the bonding member 30 in a paste form is formed by putting together the electrical conductive paste material 32 formed on the lower end side of the pillar-shaped terminal 24 and the electrical conductive paste material 31 formed on the pad 12. At this time, the active component 220 adheres to the lower surface and the lower end side of the side surface of the pillar-shaped terminal 24. Thus, the oxide film formed at the lower end side of the side surface of the pillar-shaped terminal 24 is removed.

Figure 5B:
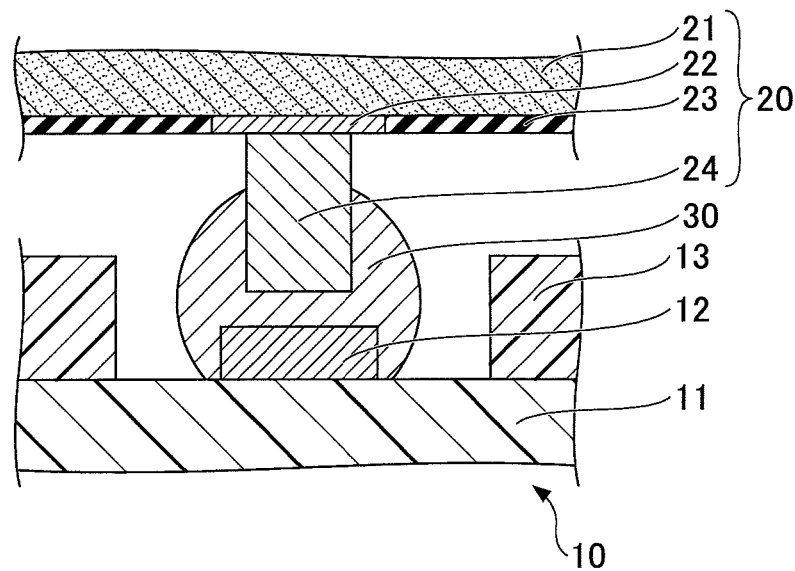

Next, in a step illustrated in FIG. 5B, the bonding member 30 in a paste form is heated. At this time, the melted bonding member 30 wets on and spreads on the lower surface and the lower end side (the portion where the oxide film is removed) of the side surface of the pillar-shaped terminal 24. Then, while the temperature of the melted bonding member 30 is being lowered to a predetermined temperature and the bonding member 30 is being solidified, the first intermetallic compound layer 40 and the second intermetallic compound layer 41 are generated at the interface of the bonding member 30 and the pad 12. Further, at the same time, the third intermetallic compound layer 50 and the fourth intermetallic compound layer 51 are formed at the interface of the bonding member 30 and the lower surface of the pillar-shaped terminal 24 and the interface of the bonding member 30 and the lower end side of the side surface of the pillar-shaped terminal 24, respectively (see FIG. 1B). As a result, the bonding member 30 and the pillar-shaped terminal 24 are strongly bonded.

Alternatively, the steps illustrated in FIG. 3B to FIG. 4A may be performed in a single step. In other words, the jig 100 provided with the protruding portion 110 having a cylindrical shape is prepare, and the active component 220 may be adhered to a front end portion of the protruding portion 110, for example. Then, the protruding portion 110 with the active component 220 may be contacted at the upper portion of the electrical conductive material 31 to push the electrical conductive material 31. With this operation, the active component 220 may be transferred to the concave portion 31x while forming the concave portion 31x. With this, the manufacturing steps of the semiconductor package 1 can be simplified and the semiconductor package 1 can be manufactured by low cost.

Further, in the step illustrated in FIG. 4C, the electrical conductive paste material 32 may not be formed at the lower end side of the pillar-shaped terminal 24 of the semiconductor chip 20. In this case, the bonding member 30 is only composed by the electrical conductive paste material 31 that is formed on the pad 12 of the wiring substrate 10.

As such, in the semiconductor package 1, the bonding member 30 and the lower end side of the side surface and the lower surface of the pillar-shaped terminal 24 are bonded, and the intermetallic compounds are formed at the interface of the bonding member 30 and the lower end side of the side surface of the pillar-shaped terminal 24 and the interface of the bonding member 30 and the lower surface of the pillar-shaped terminal 24.

As a result, different from the relative example illustrated in FIG. 2 in which only the bonding member 30 and the lower surface of the pillar-shaped terminal 24 are bonded (the bonding member 30 is not bonded with the side surface of the pillar-shaped terminal 24), the solder of the bonding member 30 can be prevented from spreading in the lateral direction and the pillar-shaped terminals 24 can be formed with a narrow pitch.

Further, as the surface area (the area of the lower surface and the lower end side of the side surface of the pillar-shaped terminal 24) of the bonding member 30 and the pillar-shaped terminal 24 becomes large, the bonding between the bonding member 30 and the pillar-shaped terminal 24 becomes strong. With this, the semiconductor package 1 of the embodiment is preferably used because the connection reliability can be maintained even when the pillar-shaped terminals 24 with a smaller diameter are used.

Further, as the bonding member 30 and the lower surface and the lower end side of the side surface of the pillar-shaped terminal 24 are strongly bonded and a void is not generated, peeling caused by moisture absorption of the void can be suppressed even when the semiconductor package is used in a condition such as at high temperature and high humidity or the like.

Further, as a position of the pillar-shaped terminal 24 to which the bonding member 30 is formed can be controlled by controlling a position of the side surface of the pillar-shaped terminal 24 to which the active component 220 is adhered, formation of the solder of the bonding member 30 at an unnecessary part of the side surface of the pillar-shaped terminal 24 can be prevented.

Alternative Example of First Embodiment

In an alternative example of the first embodiment, an example of a method of manufacturing the semiconductor package 1 different from the first embodiment is explained. In the alternative example of the first embodiment, the components same as those explained above are given the same reference numerals, and explanations are not repeated.

FIG. 6A to FIG. 7B are views illustrating an alternative example of the method of manufacturing the semiconductor package 1 of the first embodiment, and are cross-sections corresponding to FIG. 1B.

Figure 6A:
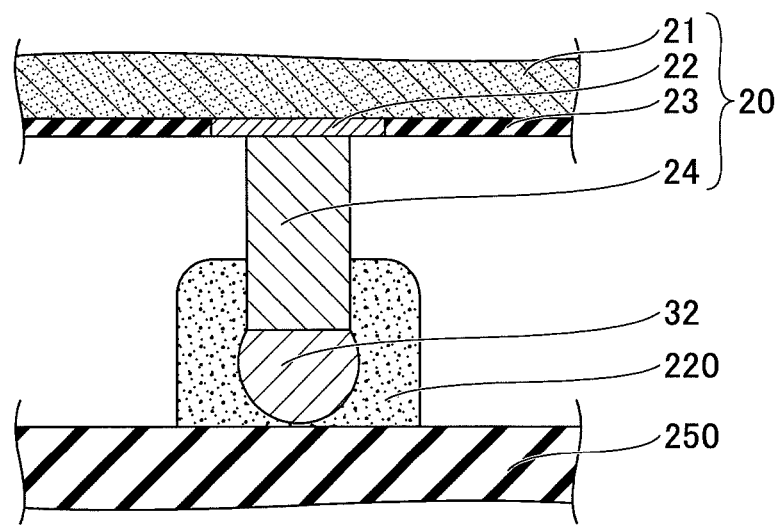
FIG. 6A and FIG. 6B are views illustrating an alternative example of the method of manufacturing the semiconductor package of the first embodiment.

First, in a step illustrated in FIG. 6A, the semiconductor chip 20 manufactured by a known method is prepared. Then, the electrical conductive paste material 32 is formed at the lower end side of the pillar-shaped terminal 24 of the semiconductor chip 20. Then, the lower end side of the pillar-shaped terminal 24 including the electrical conductive material 32 is immersed in the active component 220 provided on a jig 250, and the active component 220 is adhered to the lower end side of the pillar-shaped terminal 24 including the electrical conductive material 32.

Here, before a step illustrated in FIG. 6A, although the oxide film (not illustrated in the drawings) is formed at the entirety of the side surface of the pillar-shaped terminal 24, the oxide film formed at a portion where the active component 220 is adhered in the step illustrated in FIG. 6A is removed. Further, when an oxide film is formed at a surface of the electrical conductive material 32, the oxide film formed at the surface of the electrical conductive material 32 is also removed. Thus, spreading of the solder can be improved regardless of a surface condition of the pad 12 of the wiring substrate 10.

Figure 6B:
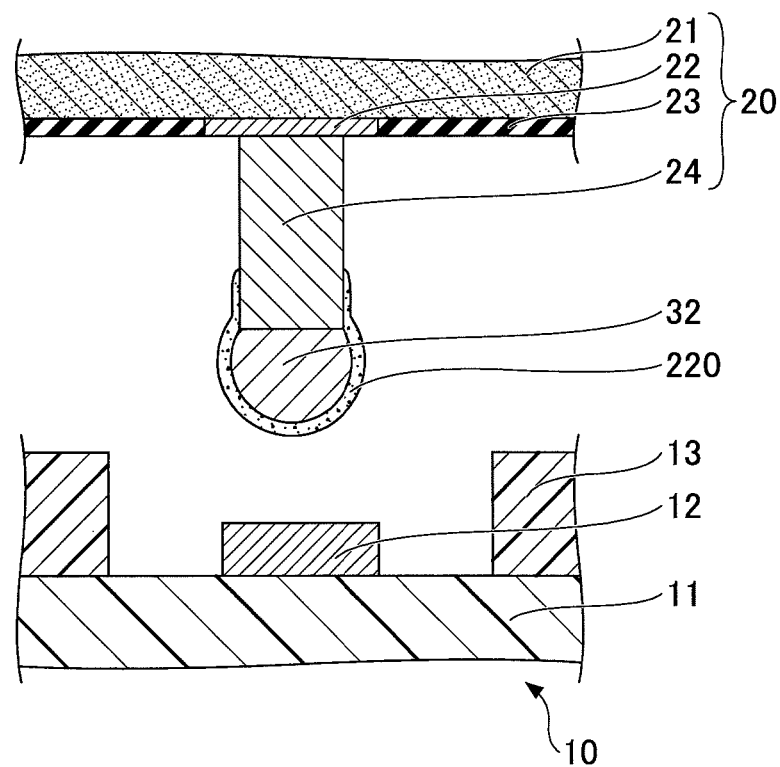

Next, in a step illustrated in FIG. 6B, the wiring substrate 10 manufactured by a known method is prepared. Then, the semiconductor chip 20 is positioned on the wiring substrate 10 such that the pillar-shaped terminal 24 (the active component 220 is adhered at the lower end side of which including the electrical conductive material 32) faces the pad 12. Here, in this example, an electrical conductive paste material is not formed on the pad 12 of the wiring substrate 10.

Figure 7A:
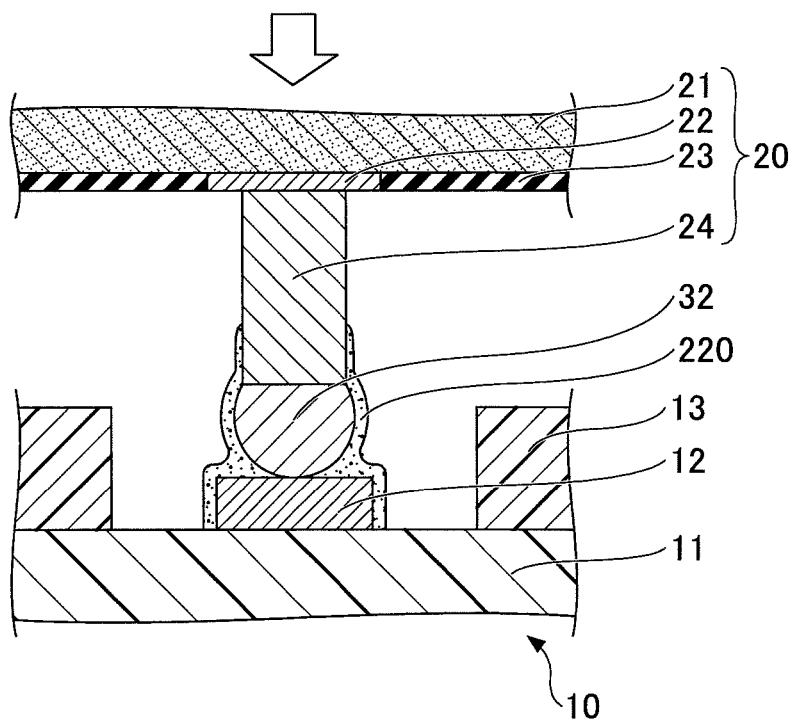
FIG. 7A and FIG. 7B are views illustrating an alternative example of the method of manufacturing the semiconductor package of the first embodiment.

Next, in a step illustrated in FIG. 7A, the semiconductor chip 20 is pushed toward the wiring substrate 10 side and the electrical conductive paste material 32 formed at the lower end side of the pillar-shaped terminal 24 is contacted the pad 12. At this time, the active component 220 adheres the upper surface and the side surface of the pad 12 and removes the oxide film formed at the upper surface and the side surface of the pad 12.

Figure 7B:
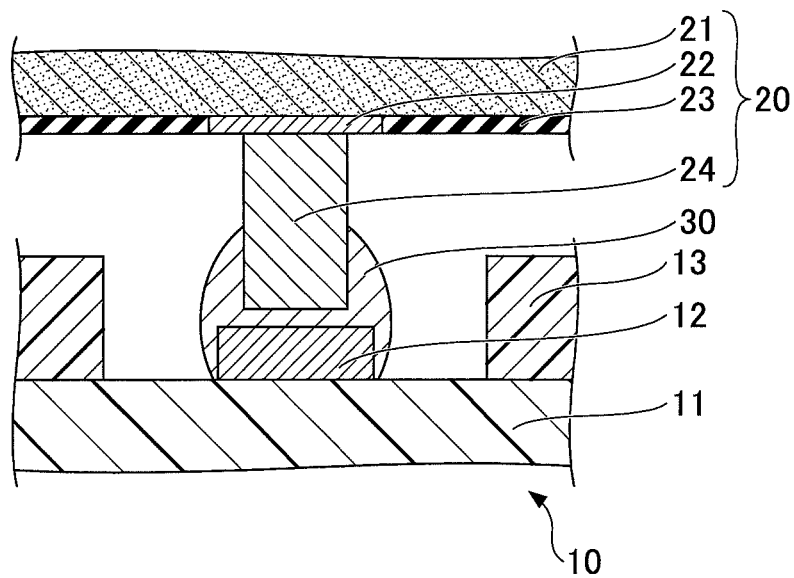

Next, in a step illustrated in FIG. 7B, the electrical conductive paste material 32 is heated. At this time, the melted electrical conductive material 32 wets on and spreads on the lower surface and the lower end side of the side surface of the pillar-shaped terminal 24 (the portion where the oxide film is removed). Then, while the temperature of the melted electrical conductive material 32 is being lowered to a predetermined temperature and the bonding member 30 is being solidified, the first intermetallic compound layer 40 and the second intermetallic compound layer 41 are generated at the interface of the bonding member 30 and the pad 12. Further, the third intermetallic compound layer 50 and the fourth intermetallic compound layer 51 are formed at the interface of the bonding member 30 and the lower surface of the pillar-shaped terminal 24 and the interface of the bonding member 30 and the lower end side of the side surface of the pillar-shaped terminal 24, respectively (see FIG. 1B). As a result, the bonding member 30 and the pillar-shaped terminal 24 are strongly bonded.

As such, according to the method of manufacturing the semiconductor package 1 of the alternative example of the first embodiment, the semiconductor package 1 having the same advantage as the first embodiment can be manufactured. Further, following advantages can also be obtained. That is, the step of the first embodiment illustrated in FIG. 3A (forming the electrical conductive material 31), the steps of the first embodiment illustrated in FIG. 3B and FIG. 3C (forming the concave portion 31x), and the steps of the first embodiment illustrated in FIG. 4A and FIG. 4B (transferring the active component 220 by the transferring pin 210) are unnecessary. With this, the manufacturing steps of the semiconductor package 1 can be simplified and the semiconductor package 1 can be manufactured by low cost.

Second Embodiment

In a second embodiment, an example of a semiconductor package different from the first embodiment is explained. In the second embodiment, the components same as those explained above are given the same reference numerals, and explanations are not repeated.

Figure 8A:
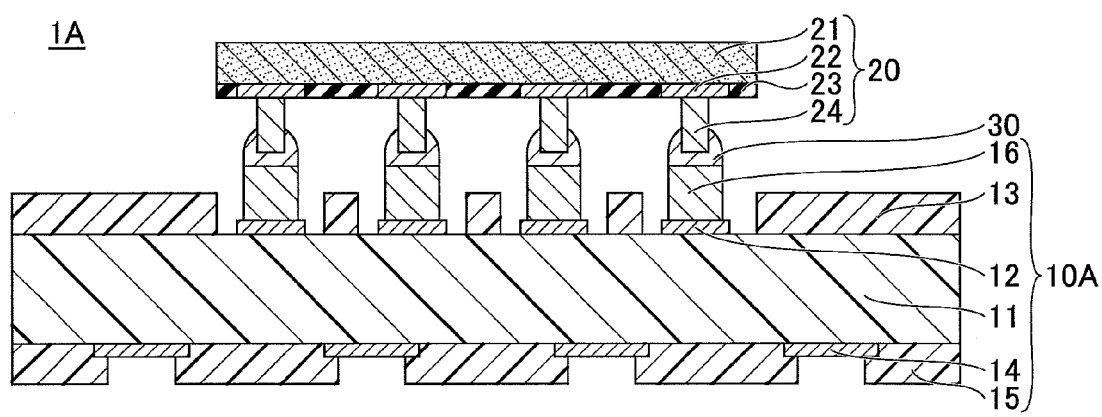
FIG. 8A and FIG. 8B are cross-sectional views illustrating an example of a semiconductor package of a second embodiment.
Figure 8B:
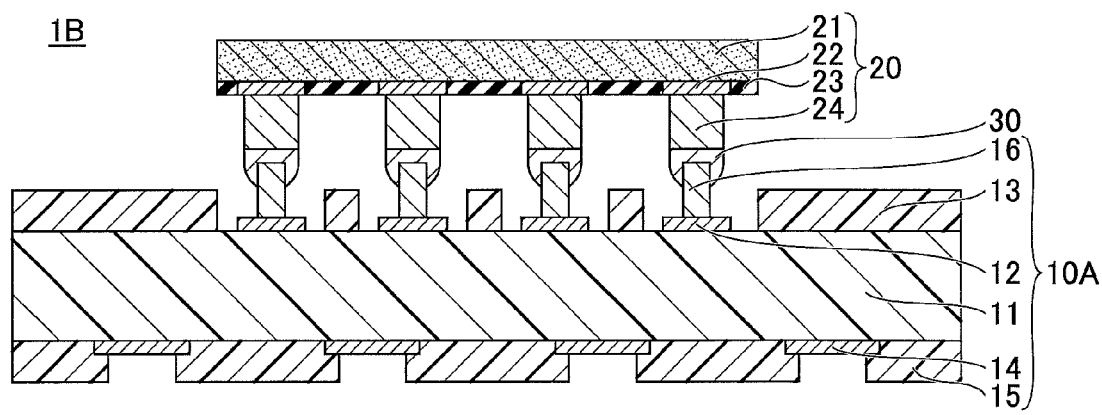

FIG. 8A and FIG. 8B are cross-sectional views illustrating an example of a semiconductor package 1A of the second embodiment. Although a pillar-shaped terminal is not provided on each of the pads 12 of the wiring substrate 10 in the semiconductor package 1 illustrated in FIG. 1A and FIG. 1B, a pillar-shaped terminal 16 is provided on each of the pads 12 of a wiring substrate 10A in the semiconductor package 1A illustrated in FIG. 8A.

The pillar-shaped terminal 16 is an electrode terminal that is provided on each of the pads 12. The shape, the height, the material or the like of the pillar-shaped terminal 16 may be the same as that of the pillar-shaped terminal 24, for example. Here, in the semiconductor package 1A illustrated in FIG. 8A, the diameter of the pillar-shaped terminal 16 is made larger than that of the pillar-shaped terminal 24. The pillar-shaped terminals 16 of the wiring substrate 10A and the pillar-shaped terminals 24 of the semiconductor chip 20 are electrically connected with each other through the bonding members 30, respectively. Each of the bonding members 30 is formed at the upper surface (the surface facing the pillar-shaped terminal 24) of the pillar-shaped terminal 16, and the lower surface (the surface facing the pillar-shaped terminal 16) and the lower end side (the pillar-shaped terminal 16 side) of the side surface of the pillar-shaped terminal 24.

Here, although not illustrate in the drawings, similar to FIG. 1B, the first intermetallic compound layer 40 and the second intermetallic compound layer 41 are generated at the interface of the bonding member 30 and the pillar-shaped terminal 16. Similarly, the third intermetallic compound layer 50 and the fourth intermetallic compound layer 51 are formed at the interface of the bonding member 30 and the pillar-shaped terminal 24.

The semiconductor package 1A may be manufactured by the steps similar to those illustrated in FIG. 3A to FIG. 5B. However, in a step illustrated in FIG. 3A, the electrical conductive paste material 31 is formed at the upper surface of the pillar-shaped terminal 16 of the wiring substrate 10A. Further, alternatively, the semiconductor package 1A may be manufactured by the steps similar to those illustrated in FIG. 6A to FIG. 7B. However, in a step illustrated in FIG. 7A, the electrical conductive paste material 32 formed at the lower end side of the pillar-shaped terminal 24 is contacted with the pillar-shaped terminal 16. At this time, when the active component 220 adheres the upper end side of the side surface of the pillar-shaped terminal 16, the oxide film formed at that portion is removed. Thus, the upper end side of the side surface of the pillar-shaped terminal 16 is also bonded with the bonding member 30.

Similar to the semiconductor package 1B as illustrated in FIG. 8B, the diameter of the pillar-shaped terminal 16 may be made smaller than that of the pillar-shaped terminal 24. The bonding member 30 is formed at the upper surface (the surface facing the pillar-shaped terminal 24) and the upper end side (pillar-shaped terminal 24 side) of the side surface of the pillar-shaped terminal 16, and the lower surface (the surface facing the pillar-shaped terminal 16) of the pillar-shaped terminal 24 in the semiconductor package 1B.

Here, not illustrated in the drawings, similar to FIG. 1B, the first intermetallic compound layer 40 and the second intermetallic compound layer 41 are generated at the interface of the bonding member 30 and the pillar-shaped terminal 16. Similarly, the third intermetallic compound layer 50 and the fourth intermetallic compound layer 51 are generated at the interface of the bonding member 30 and the pillar-shaped terminal 24.

The semiconductor package 1B may be manufactured by the same steps of those illustrated in FIG. 3A to FIG. 5B. However, in the steps illustrated in FIG. 3A to FIG. 4B, the electrical conductive paste material 31 is formed at the lower surface of the pillar-shaped terminal 24 of the semiconductor chip 20, the concave portion 31x is formed at the electrical conductive material 31, and the active component 220 is transferred in the concave portion 31x. Then, in the step illustrated in FIG. 4C, the electrical conductive paste material 32 is formed at the upper surface of the pillar-shaped terminal 16 of the wiring substrate 10A. Then, the semiconductor chip 20 is positioned on the wiring substrate 10A such that the pillar-shaped terminal 24 faces the pillar-shaped terminal 16.

Then, in the step illustrated in FIG. 5A, the semiconductor chip 20 is pushed toward the wiring substrate 10A side and the bonding member 30 in a paste form is formed by putting together the electrical conductive paste material 32 formed at the upper end side of the pillar-shaped terminal 16 and the electrical conductive paste material 31 formed at the lower surface of the pillar-shaped terminal 24. At this time, the active component 220 adheres the upper surface and the upper end side of the side surface of the pillar-shaped terminal 16 and the oxide film formed at the upper end side of the side surface of the pillar-shaped terminal 16 is removed. Then, the step same as illustrated in FIG. 5B is performed.

Further, the semiconductor package 1B may be manufactured by the steps similar to those illustrated in FIG. 6A to FIG. 7B. However, in the step illustrated in FIG. 7A, the electrical conductive paste material 32 formed at the lower end side of the pillar-shaped terminal 24 is contacted with the pillar-shaped terminal 16. At this time, when the active component 220 adheres the upper end side of the side surface of the pillar-shaped terminal 16, the oxide film formed at that portion is removed. Thus, the upper end side of the side surface of the pillar-shaped terminal 16 is also bonded with the bonding member 30.

As such, the pillar-shaped terminals may also be provided at the wiring substrate side, and in such a case, the diameter of either one of the pillar-shaped terminal at the wiring substrate side and the pillar-shaped terminal at the semiconductor chip side may be made larger than that of the other one. Further, although not illustrated in the drawings, the diameters of the pillar-shaped terminal at the wiring substrate side and the pillar-shaped terminal at the semiconductor chip side may be the same.

Third Embodiment

In a third embodiment, another example of a semiconductor package different from the first embodiment is explained. In the second embodiment, the components same as those explained above are given the same reference numerals, and explanations are not repeated.

Figure 9:
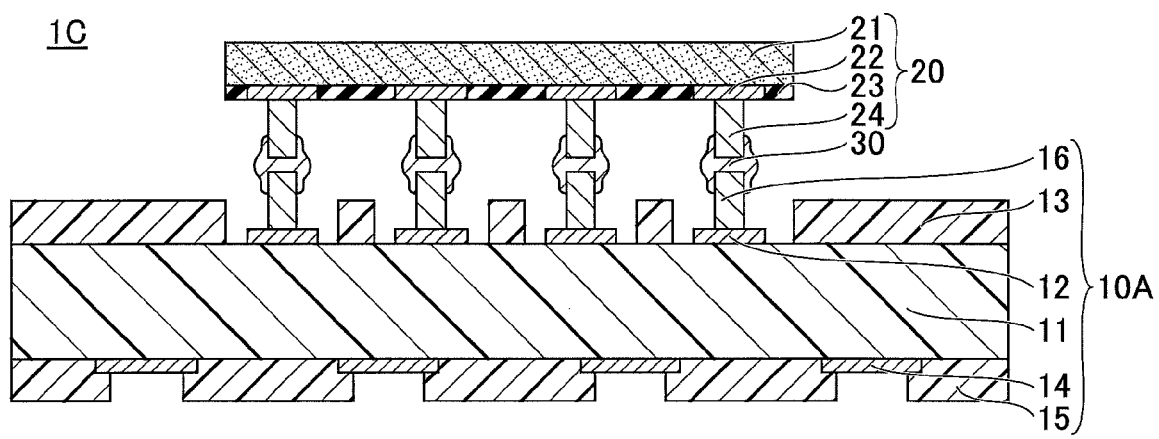
FIG. 9 is a cross-sectional view illustrating an example of a semiconductor package of a third embodiment.

FIG. 9 is a cross-sectional view illustrating a semiconductor package 10 of a third embodiment. Although a pillar-shaped terminal is not provided on each of the pads 12 of the wiring substrate 10 in the semiconductor package 1 illustrated in FIG. 1A and FIG. 1B, the pillar-shaped terminal 16 is provided on each of the pads 12 of a wiring substrate 10A in the semiconductor package 1A illustrated in FIG. 9.

The pillar-shaped terminal 16 (first pillar-shaped terminal) is an electrode terminal provided on the pad 12. The shape, the height, the material or the like of the pillar-shaped terminal 16 may be the same as that of the pillar-shaped terminal 24 (second pillar-shaped terminal), for example. In the semiconductor package 1C illustrated in FIG. 9, an example that the diameters of the pillar-shaped terminal 16 and the pillar-shaped terminal 24 are the same is illustrated. The pillar-shaped terminal 16 of the wiring substrate 10A and the pillar-shaped terminal 24 of the semiconductor chip 20 are electrically connected with each other through the bonding member 30. The bonding member 30 is formed at the upper surface (the surface facing the pillar-shaped terminal 24) and the upper end side (pillar-shaped terminal 24 side) of the side surface of the pillar-shaped terminal 16, and the lower surface (the surface facing the pillar-shaped terminal 16) and the lower end side (the pillar-shaped terminal 16 side) of the side surface of the pillar-shaped terminal 24.

Although not illustrated, similar to FIG. 1B, the first intermetallic compound layer 40 and the second intermetallic compound layer 41 are generated at the interface of the bonding member 30 and the pillar-shaped terminal 16. Similarly, the third intermetallic compound layer 50 and the fourth intermetallic compound layer 51 are generated at the interface of the bonding member 30 and the pillar-shaped terminal 24.

Figure 10A:
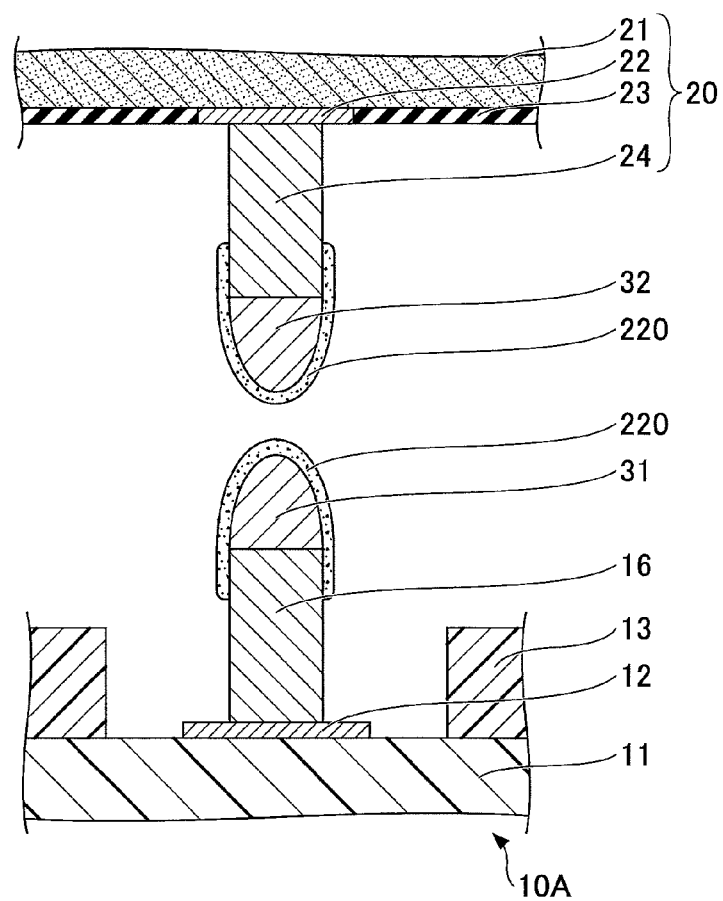
FIG. 10A and FIG. 10B are views illustrating an example of a method of manufacturing the semiconductor package of the third embodiment.
Figure 10B:
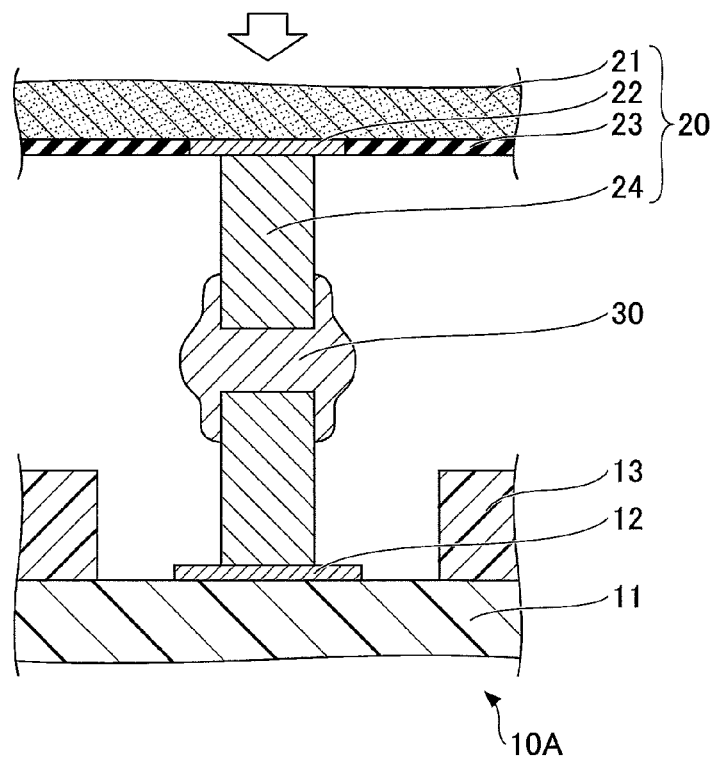

A method of manufacturing the semiconductor package 10 is illustrated in FIG. 10A and FIG. 10B. First, in a step illustrated in FIG. 10A, similar to FIG. 3A, the electrical conductive paste material 31 is formed at the upper surface of the pillar-shaped terminal 16 of the wiring substrate 10A. Then, similar to FIG. 6A, the active component 220 is adhered to the upper end side of the pillar-shaped terminal 16 including the electrical conductive material 31. Further, similar to FIG. 4C, the electrical conductive paste material 32 is formed at the lower end side of the pillar-shaped terminal 24 of the semiconductor chip 20. Then, similar to FIG. 6A, the active component 220 is adhered to the lower end side of the pillar-shaped terminal 24 including the electrical conductive material 32. The oxide films are removed at the portion to which the active component 220 is adhered. Then, the semiconductor chip 20 is positioned above the wiring substrate 10A such that the pillar-shaped terminal 24 faces the pillar-shaped terminal 16. At this time, as described above, the active component 220 is adhered at the lower end side including the electrical conductive material 32 of the pillar-shaped terminal 24 and the active component 220 is adhered at the upper end side including the electrical conductive material 31 of the pillar-shaped terminal 16.

Next, in a step illustrated in FIG. 10B, the semiconductor chip 20 is pushed toward the wiring substrate 10A and the bonding member 30 in a paste form is formed by putting together the electrical conductive paste material 32 formed at the lower end side of the pillar-shaped terminal 24 and the electrical conductive paste material 31 formed at the upper surface of the pillar-shaped terminal 16. Then, the bonding member 30 in a paste form is heated. At this time, the melted bonding member 30 wets on and spreads on the upper surface and the upper end side (the part where the oxide film is removed) of the side surface of the pillar-shaped terminal 16 and the lower surface and the lower end side (the part where the oxide film is removed) of the side surface of the pillar-shaped terminal 24.

Then, while the temperature of the melted bonding member 30 is being lowered to a predetermined temperature and the bonding member 30 is being solidified, the first intermetallic compound layer 40 and the second intermetallic compound layer 41 are generated at the interface of the bonding member 30 and the upper surface of the pillar-shaped terminal 16 and the interface of the bonding member 30 and the upper end side of the side surface of the pillar-shaped terminal 16. Further, at the same time, the third intermetallic compound layer 50 and the fourth intermetallic compound layer 51 are generated at the interface of the bonding member 30 and the lower surface of the pillar-shaped terminal 24 and the interface of the bonding member 30 and the lower end side of the side surface of the pillar-shaped terminal 24 (see FIG. 1B). As a result, the bonding member 30 and the pillar-shaped terminal 16, and the bonding member 30 and the pillar-shaped terminal 24 are strongly bonded.

As such, according to the method of manufacturing the semiconductor package 1C of the third embodiment, following advantages in addition to the advantages the same as the first embodiment can be obtained. That is, a surface area (surface area of the upper surface and the upper end side of the side surface of the pillar-shaped terminal 16, and the surface area of the lower surface and the lower end side of the side surface of the pillar-shaped terminal 24) of bonding portions of the bonding member 30 and the pillar-shaped terminal 16, and the bonding member 30 and the pillar-shaped terminal 24 is large. Thus, the bonding member 30 and the pillar-shaped terminal 16, and the bonding member 30 and the pillar-shaped terminal 24 are further strongly bonded. With this, the semiconductor package 1C of the embodiment is preferably used because the connection reliability can be maintained even when the pillar-shaped terminals 16 and 24 with a smaller diameter are used.

According to the embodiment, a semiconductor package or the like capable of forming pillar-shaped terminals with a narrow pitch while maintaining connection reliability can be provided.

Although a preferred embodiment of the semiconductor package and the method of manufacturing the semiconductor package has been specifically illustrated and described, it is to be understood that minor modifications may be made therein without departing from the spirit and scope of the invention as defined by the claims.

The present invention is not limited to the specifically disclosed embodiments, and numerous variations and modifications may be made without departing from the spirit and scope of the present invention.

For example, a metal film such as nickel (Ni) or the like may be provided at the upper surface of the pillar-shaped terminal 16 or the lower surface of the pillar-shaped terminal 24. By providing the metal film, unnecessary generation of intermetallic compounds (alloy) at the interfaces between the pillar-shaped terminals 16 or 24 and the bonding members 30 can be prevented.

Various aspects of the subject-matter described herein are set out non-exhaustively in the following numbered clauses:

1. A method of manufacturing a semiconductor package, comprising:

preparing a wiring substrate that includes a first conductive member and a semiconductor chip that is mounted on the wiring substrate and includes a second conductive member, at least one of the first conductive member and the second conductive member being a pillar-shaped terminal;

adhering an active component capable of removing an oxide film to a portion of a side surface of the pillar-shaped terminal; and forming a bonding member that bonds and electrically connects the first conductive member and the second conductive member, the bonding member being bonded to an end surface of the pillar-shaped terminal and the portion of the side surface of the pillar-shaped terminal, an intermetallic compound layer being formed at an interface of the bonding member and the pillar-shaped terminal.

2. The method of manufacturing the semiconductor package according to clause 1, wherein the first conductive member is a pad and the second conductive member is the pillar-shaped terminal, and wherein in the forming the bonding member, the bonding member bonds an end surface of the pillar-shaped terminal at a pad side, a portion of a side surface of the pillar-shaped terminal, and an end surface of the pad at a pillar-shaped terminal side, and an intermetallic compound layer is formed at an interface of the bonding member and the pillar-shaped terminal.

3. The method of manufacturing the semiconductor package according to clause 1, wherein the adhering the active component includes, providing an electrical conductive paste material, which becomes the bonding member after being solidified, on the pad, forming an concave portion at the electrical conductive paste material, providing the active component in the concave portion, after positioning the wiring substrate and the semiconductor chip such that the pad faces the pillar-shaped terminal, pressing an end portion of the pillar-shaped terminal toward an electrical conductive paste material side through the active component so that the active component is adhered at the portion of the side surface and the end surface of the pillar-shaped terminal.

4. The method of manufacturing the semiconductor package according to clause 1,
wherein the pillar-shaped terminal is made of copper or copper alloy,
wherein the bonding member includes tin, and
wherein the intermetallic compound layer is made of an intermetallic compound of copper and tin.

5. The method of manufacturing the semiconductor package according to clause 1,
wherein in the adhering the active component, immersing the pillar-shaped terminal in the active component.

6. The method of manufacturing the semiconductor package according to clause 1,
wherein the first conductive member is a first pillar-shaped terminal and the second conductive member is a second pillar-shaped terminal, and
wherein in the forming the bonding member, the bonding member bonds an end surface of the first pillar-shaped terminal at a second pillar-shaped terminal side, an end surface of the second pillar-shaped terminal at a first pillar-shaped terminal side, and the portion of the side surface of the one of the first pillar-shaped terminal and the second pillar-shaped terminal, and intermetallic compound layers are formed at an interface of the bonding member and the first pillar-shaped terminal and an interface of the bonding member and the second pillar-shaped terminal, respectively.

7. The method of manufacturing the semiconductor package according to clause 6,
wherein in the adhering the active component, the active component is adhered to a portion of a side surface of the first pillar-shaped terminal and a portion of a side surface of the second pillar-shaped terminal, and
wherein in the forming the bonding member, the bonding member bonds the end surface of the first pillar-shaped terminal at the second pillar-shaped terminal side, the end surface of the second pillar-shaped terminal at the first pillar-shaped terminal side, the portion of the side surface of the first pillar-shaped terminal and the portion of the side surface of the second pillar-shaped terminal, and intermetallic compound layers are formed at the interface of the bonding member and the first pillar-shaped terminal and the interface of the bonding member and the second pillar-shaped terminal, respectively.

What is claimed is:

1. A semiconductor package comprising:
a wiring substrate that includes a first conductive member;
a semiconductor chip that is mounted on the wiring substrate and includes a second conductive member,
the first conductive member and the second conductive member being positioned to face each other; and
a bonding member that bonds and electrically connects the first conductive member and the second conductive member,
at least one of the first conductive member and the second conductive member being a pillar-shaped terminal,
the bonding member being bonded to an end surface of the pillar-shaped terminal and a partial portion of a side surface of the pillar-shaped terminal,
an intermetallic compound layer of a first material composing the bonding member and a second material composing the pillar-shaped terminal being formed at an interface of the bonding member and the pillar-shaped terminal at the end surface of the pillar-shaped terminal and the partial portion of the side surface of the pillar-shaped terminal,
wherein the intermetallic compound layer does not cover the entirety of the side surface of the pillar-shaped terminal.

2. The semiconductor package according to claim 1,
wherein the first conductive member is a pad and the second conductive member is the pillar-shaped terminal, and
wherein the bonding member bonds an end surface of the pillar-shaped terminal at a pad side, a partial portion of a side surface of the pillar-shaped terminal, and an end surface of the pad at a pillar-shaped terminal side.

3. The semiconductor package according to claim 2,
wherein the intermetallic compound layer is formed at the entirety of the interface of the bonding member and the pillar-shaped terminal.

4. The semiconductor package according to claim 1, further comprising:
an oxide film formed at another partial portion of the side surface of the pillar-shaped terminal at which the bonding member is not bonded.

5. The semiconductor package according to claim 1,
wherein the pillar-shaped terminal is made of copper or copper alloy,
wherein the bonding member includes tin, and
wherein the intermetallic compound layer is made of an intermetallic compound of copper and tin.

6. The semiconductor package according to claim 1,
wherein the first conductive member is a first pillar-shaped terminal and the second conductive member is a second pillar-shaped terminal,
wherein the bonding member bonds an end surface of the first pillar-shaped terminal at a second pillar-shaped terminal side, an end surface of the second pillar-shaped terminal at a first pillar-shaped terminal side, and at least one of a partial portion of a side surface of the first pillar-shaped terminal and a partial portion of a side surface of the second pillar-shaped terminal, and
wherein intermetallic compound layers are formed at an interface of the bonding member and the first pillar-shaped terminal and an interface of the bonding member and the second pillar-shaped terminal, respectively.

7. The semiconductor package according to claim 6,
wherein the intermetallic compound layer is formed at the entirety of the interface of the bonding member and the pillar-shaped terminal.

8. The semiconductor package according to claim 1,
wherein the intermetallic compound layer is formed at the entirety of the interface of the bonding member and the pillar-shaped terminal.

9. The semiconductor package according to claim 1,
wherein the intermetallic compound layer includes a first intermetallic compound layer and a second intermetallic compound layer whose composition is different from the composition of the first intermetallic compound layer.

* * * * *